United States Patent
Doyle et al.

(10) Patent No.: US 7,023,032 B1
(45) Date of Patent: Apr. 4, 2006

(54) MOS TRANSISTOR WITH SERRATED GATE STRUCTURES

(75) Inventors: James Thomas Doyle, Nederland, CO (US); Michael Angelo Tamburrino, Longmont, CO (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/824,270

(22) Filed: Apr. 14, 2004

Related U.S. Application Data

(62) Division of application No. 10/272,035, filed on Oct. 15, 2002, now Pat. No. 6,744,288.

(51) Int. Cl.
*H01L 29/745* (2006.01)
*H01L 21/4763* (2006.01)

(52) U.S. Cl. ............... 257/213; 257/700; 257/758; 438/618; 438/622

(58) Field of Classification Search ........... 257/700, 257/758, 213; 438/618, 622; 327/108–112, 327/379, 382, 436, 437, 534, 535
See application file for complete search history.

(56) References Cited

U.S. PATENT DOCUMENTS

| | | | |
|---|---|---|---|
| 4,247,916 A * | 1/1981 | Erb | 365/185.03 |
| 4,462,041 A * | 7/1984 | Glenn | 257/401 |
| 4,725,747 A * | 2/1988 | Stein et al. | 327/389 |
| 5,793,068 A * | 8/1998 | Mahant-Shetti | 257/204 |
| 6,686,300 B1 * | 2/2004 | Mehrotra et al. | 438/142 |

OTHER PUBLICATIONS

Dragan Maksimovic, Bruno Kranzen, Sandeep Dhar and Ravindra Ambatipudi, U.S. Appl. No. 10/053,226, filed Jan. 19, 2002, entitled "An Adaptive Voltage Scaling Digital Processing Component and Method of Operating the Same".

Bruno Kranzen and Dragan Maksimovic, U.S. Appl. No. 10/053,227, filed Jan. 19, 2002, entitled "Adaptive Voltage Scaling Clock Generator for Use in a Digital Processing Component and Method of Operating the Same".

Dragan Maksimovic and Sandeep Dhar, U.S. Appl. No. 10/053,858, filed Jan. 19, 2002, entitled "System for Adjusting a Power Supply Level of a Digital Processing Component and Method of Operating the Same".

Dragan Maksimovic, Ravindra Ambatipudi, Sandeep Dhar and Bruno Krazen, U.S. Appl. No. 10/053,228, filed Jan. 19, 2002, entitled "An Adaptive Voltage Scaling Power Supply for Use in a Digital Processing Component and Method of Operating the Same".

(Continued)

*Primary Examiner*—David Nelms
*Assistant Examiner*—Long Tran
(74) *Attorney, Agent, or Firm*—Mark C. Pickering

(57) ABSTRACT

A digital power supply system provides a supply voltage to semiconductor circuits. The power supply system utilizes a pulse width modulator to output a signal into a LC filter that generates a DC supply voltage. The width of the pulses output by the pulse width modulator are defined by an encoder that generates width information in response to a propagation delay detector that measures the propagation delay of a first clock signal when clocked by a second clock signal.

16 Claims, 6 Drawing Sheets

OTHER PUBLICATIONS

James T. Doyle and Dragan Maksimovic, U.S. Appl. No. 10/106,428, filed Mar. 26, 2002, entitled "Method and System for Minimizing Power Consumption in Mobile Devices Using Cooperative Adaptive Voltage and Threshold Scaling".

Dragan Maksimovic and James Thomas Doyle, U.S. Appl. No. 10/166,822, filed Jun. 10, 2002, entitled "Serial Digital Communication Superimposed on a Digital Signal Over a Single Wire".

Dragan Maksimovic and Sandeep Dhar, U.S. Appl. No. 10/236,482, filed Sep. 6, 2002, entitled "Method and System for Providing Self-Calibration for Adaptively Adjusting a Power Supply Voltage in a Digital Processing System".

Mark F. Rives, U.S. Appl. No. 10/246,971, filed Sep. 19, 2002, entitled "Power Supply System and Method that Utilizes an Open Loop Power Supply Control".

Jim Doyle and Bill Broach, Small Gains in Power Efficiency Now, Bigger Gains Tomorrow [online]. Jul. 9, 2002 [retrieved on Feb. 1, 2003]. Retrieved from the Internet: <URL: http://www.commsdesign.com/design_corner/OEG20020709S0022>. pps. 1-5.

Robert W. Erickson and Dragan Maksimovic, *Fundamentals of Power Electronics,* Second Edition, Kluwer Academic Publishers, 2001, pp. 333.

Krisztian Flautner, Steven Reinhardt and Trevor Mudge, Automatic Performance Setting for Dynamic Voltage Scaling, Wireless Networks, vol. 8, Issue 5, Sep. 2002, pps. 507-520, and Citation, pps. 1-3, [online]. [retrieved on Feb. 2, 2003]. Retrieved from the Internet: <URL: http://portal.acm.org/citation.cfm?id=582455.582463&coll=portal&dl=ACM&idx=J804&p...>.

Krisztian Flautner, Steven Reinhardt and Trevor Mudge, Automatic Performance Setting for Dynamic Voltage Scaling [online]. May 30, 2001, [retrieved on Feb. 2, 2003]. Retrieved from the Internet: <URL: http://www.eecs.umich.edu/~tnm/papers/mobicom01.pdf>. pps. 1-12.

Texas Instruments, "Synchronous-Buck PWM Controller With NMOS LDO Controller", TPS5110, SLVS025A-Apr. 2002, Revised Jun. 2002.

Joonho Gil, Minkyu Je, Jongho Lee and Hyungcheol Shin, "A High Speed and Low Power SOI Inverter Using Active Body-Bias", Association of Computing Machinery, ISLPED98, Monterey, CA, 1998, pps. 59-63.

Oliver Weinfurtner, Switcher Output Stages on Neptune 28 (CMOS7-5), Neptune 28 Output Stage Results, Sep. 24, 2001, pps. 1-8.

Intel XScale Core, Developer's Manual, Dec. 2000, [online], [retrieved on Feb. 2, 2003]. Retrieved from the Internet: <URL: http://developer.intel.com/design/intelxscale/27347301.pdf>. pps. 1-1 through B-1.

U.S. Appl. No. 10/053,858, filed Jan. 19, 2002, Maksimovic et al.

U.S. Appl. No. 10/106,428, filed Mar. 26, 2002, Doyle et al.

* cited by examiner

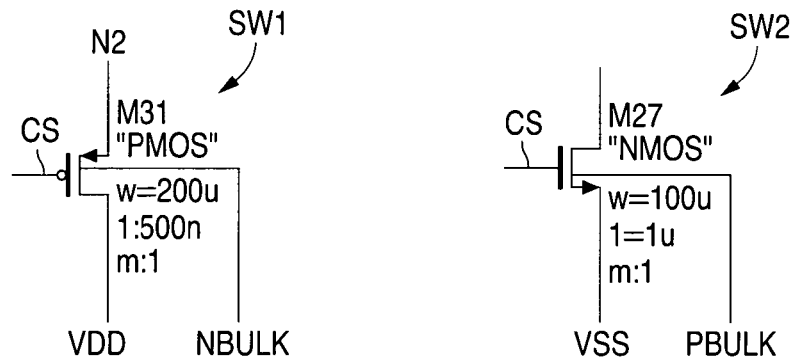
FIG. 4A  FIG. 4B
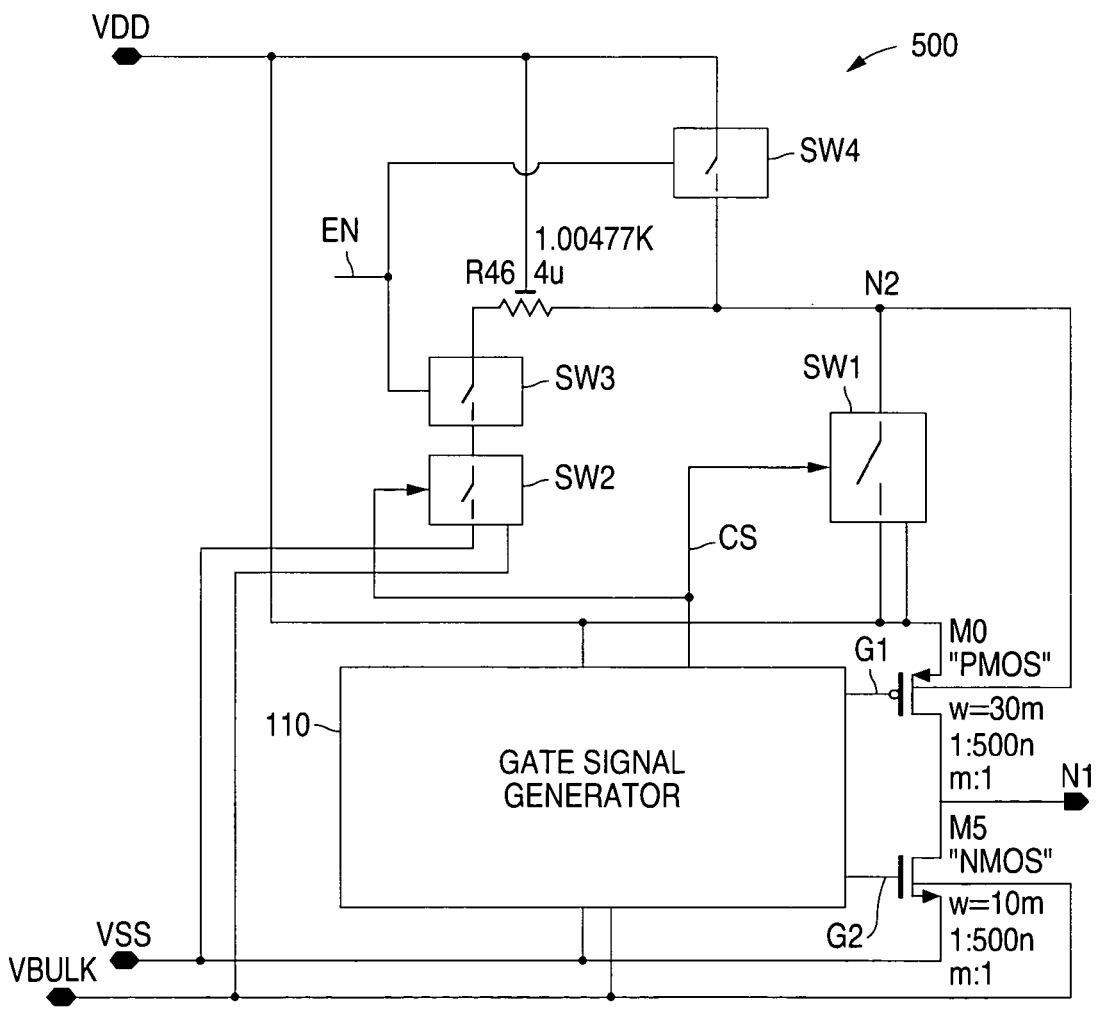
FIG. 5

MOS TRANSISTOR WITH SERRATED GATE STRUCTURES

This is a divisional application of application Ser. No. 10/272,035 filed on Oct. 15, 2002 now U.S. Pat. No. 6,744,288.

BACKGROUND OF THE INVENTION

1. Field of the Invention

The present invention relates to drivers and, more particularly, to a driver with a bulk switching MOS power transistor.

2. Description of the Related Art

A MOS transistor is a well-known circuit device that controllably varies the current that flows between a source region and a drain region. A MOS power transistor is a larger MOS transistor that is capable of handling much larger magnitudes of current. A driver is another well-known circuit device that utilizes a PMOS power transistor and an NMOS power transistor.

The PMOS transistor has a source connected to a voltage source, and a drain connected to an output node. In addition, the PMOS transistor has a gate, and an n-bulk that is connected to the voltage source. The NMOS transistor has a source connected to ground, and a drain connected to the output node. Further, the NMOS transistor has a gate, and a p-bulk that is connected to ground.

In operation, when an input signal transitions from a logic low to a logic high, the PMOS transistor turns off and the NMOS transistor turns on. As a result, the NMOS transistor pulls the output node to ground. On the other hand, when the input signal transitions from a logic high to a logic low, the NMOS transistor turns off and the PMOS transistor turns on. As a result, the PMOS transistor pulls the output node up to approximately the voltage source.

One of the advantages of the above-described driver is that only one transistor is on when the input logic state is either a logic high or a logic low. To minimize leakage current when the PMOS and NMOS transistors are turned off, the n-bulk and p-bulk, respectively, are held at the voltage source and ground, respectively.

BRIEF DESCRIPTION OF THE DRAWINGS

FIGS. 4A and 4B are circuit diagrams illustrating examples of switches SW1 and SW2, respectively, in accordance with the present invention.

FIG. 5 is a circuit diagram illustrating an output stage 500 in accordance with an alternate embodiment of the present invention.

FIG. 7A is a plan view, while FIG. 7B is a cross-sectional view taken along lines 7B—7B of FIG. 7A.

FIG. 8A is a plan view, while FIG. 8B is a cross-sectional view taken along lines 8B—8B of FIG. 8A.

DETAILED DESCRIPTION

Figure 1:
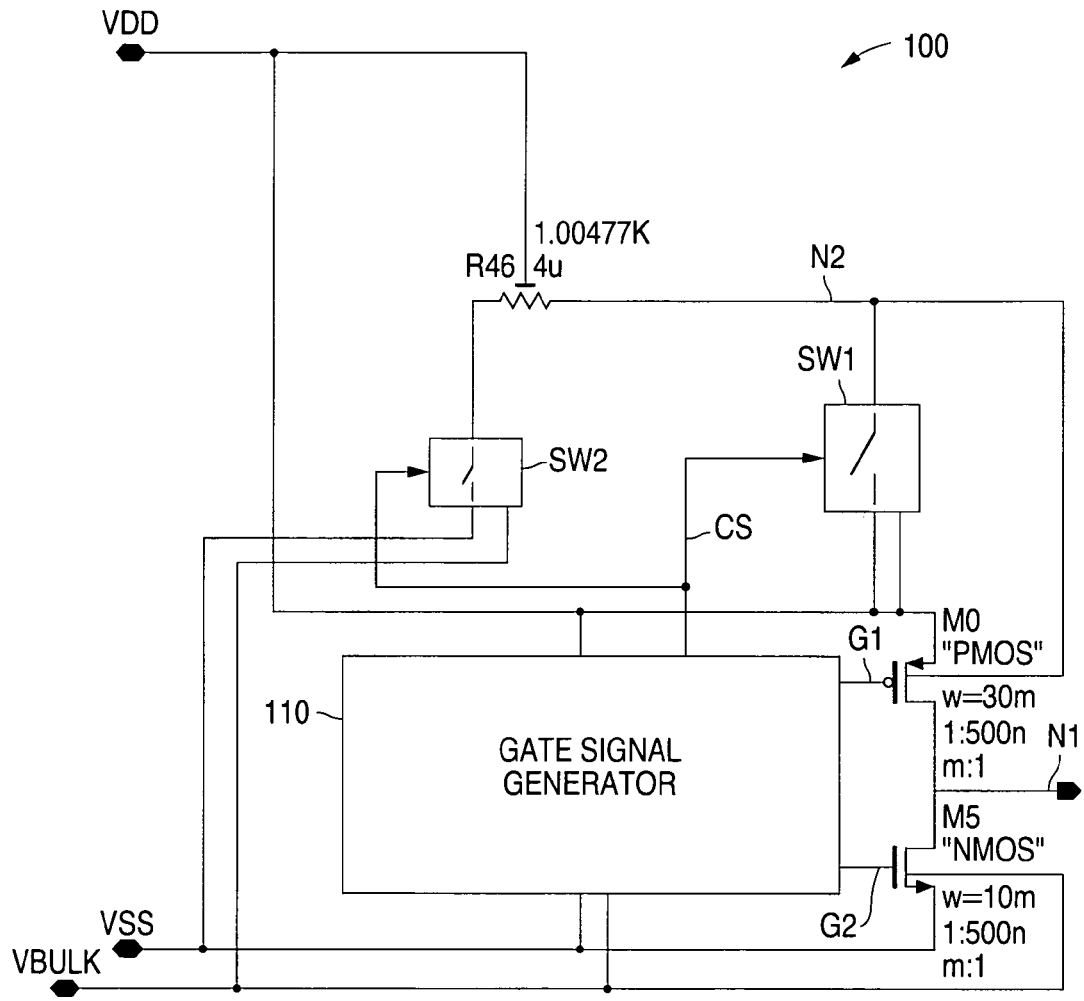
FIG. 1 is a block diagram illustrating an example of a driver stage 100 in accordance with the present invention.

FIG. 1 shows a block diagram that illustrates an example of a driver stage 100 in accordance with the present invention. As shown in FIG. 1, driver stage 100 includes a p-channel MOS transistor M0 that has a p+ source connected to a supply voltage VDD, and a p+ drain connected to a first node N1. In addition, PMOS transistor M0 has a gate, and an n-well connected to a second node N2.

Driver stage 100 also has an n-channel MOS transistor M5 that has an n+ source connected to ground VSS, and an n+ drain connected to first node N1. In addition, NMOS transistor M5 has a gate, and a p-substrate connected to a bulk voltage VBULK. PMOS transistor M0 is a large driver transistor that sources a large current to first node N1, while NMOS transistor M5 a large driver transistor that sinks a large current from first node N1.

As further shown in FIG. 1, driver stage 100 includes a gate signal generator 110 that outputs a PMOS gate signal G1 to transistor M0, an NMOS gate signal G2 to transistor M5, and a control signal CS. Gate signals G1 and G2 are non-overlapping, while control signal CS can be implemented as the inverse of gate signal G1.

Figure 2A:
FIGS. 2A–2B are timing diagrams illustrating the operation of gate signal generator 110 in accordance with the present invention.
Figure 2B:

FIGS. 2A–2B show timing diagrams that illustrate the operation of gate signal generator 110 in accordance with the present invention. As shown in FIGS. 2A–2B, gate signal generator 110 outputs the gate signals G1 and G2 so that the voltage on gate signal G2 is equal to or less than a turn off voltage TF1 (that turns off transistor M5) before the voltage on gate signal G1 is equal to a turn on voltage TN1 (that turns on transistor M0). Similarly, the voltage on gate signal G1 is equal to or greater than a turn off voltage TF2 (that turns off transistor M0) before the voltage on gate signal G2 is equal to a turn on voltage TN2 (that turns on transistor M5).

The turn off voltages TF1 and TF2 turn off transistors M5 and M0, respectively, such that no current flows out of the drains of the transistors (other than a very small leakage current). The turn on voltages TN1 and TN2 turn on transistors M0 and M5, respectively, such that a current in excess of a leakage current flows out of the drains of the transistors.

Thus, as shown in FIGS. 2A–2B, gate signal generator 110 prevents transistors M0 and M5 from being turned on at the same time. By preventing transistors M0 and M5 from being turned on at the same time, gate signal generator 110 saves the power that would be wasted if transistor M5 sunk current directly from transistor M0.

Figure 3:
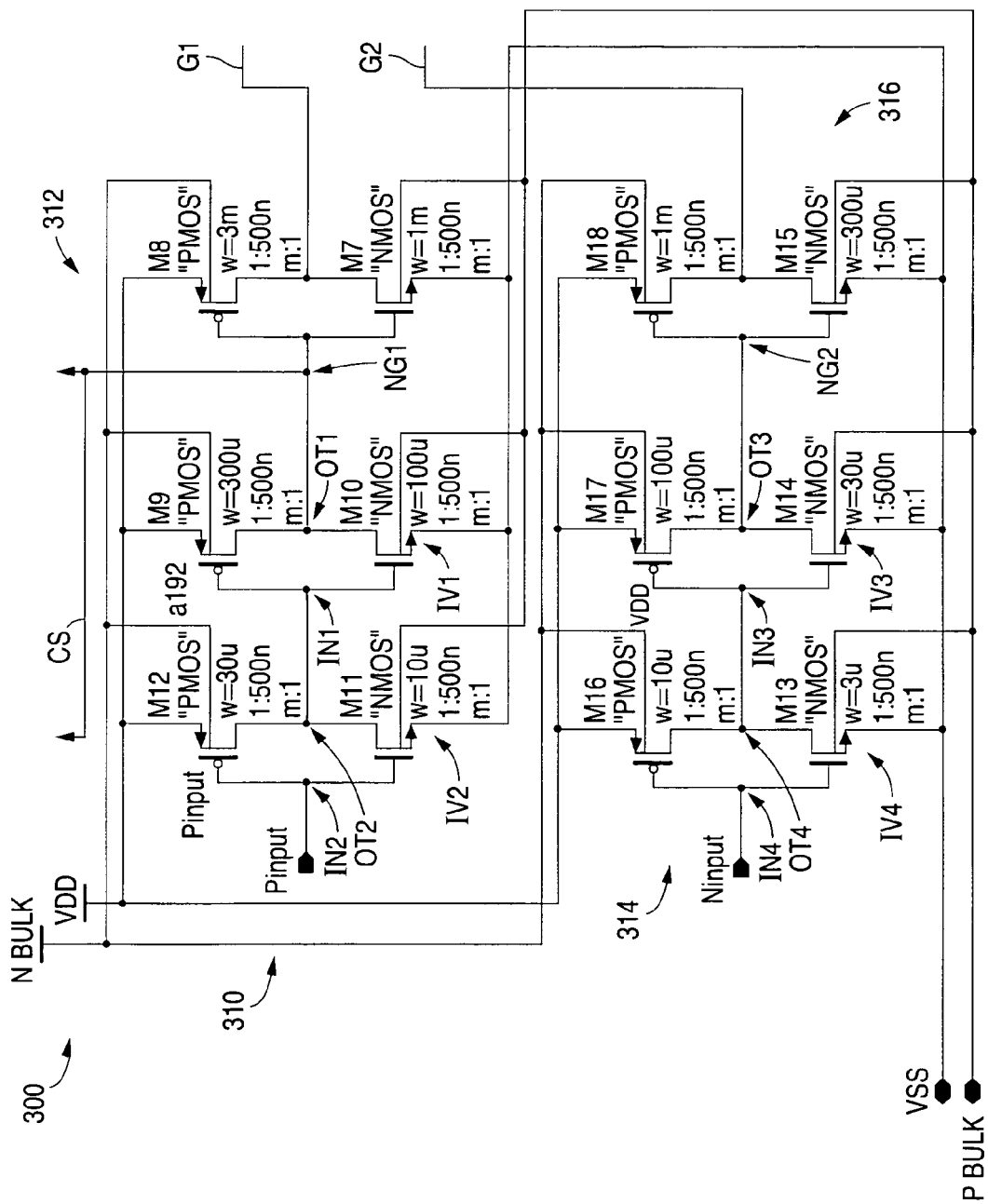
FIG. 3 is a circuit diagram illustrating an example of a gate signal generator 110 in accordance with the present invention.

FIG. 3 shows a circuit diagram that illustrates an example of a gate signal generator 300 in accordance with the present invention. As shown in FIG. 3, gate signal generator 300 has a p-channel delay path 310 that includes a p-path inverter 312, and an n-channel delay path 314 that includes an n-path inverter 316.

P-path inverter 312 includes a PMOS transistor M8 and a NMOS transistor M7 that have gates connected to a gate node NG1 and drains that are connected to the gate of transistor M0. In addition, in this example, the control signal CS is taken from the p-path 310 and output from the gate node NG1.

Further, as shown in FIG. 3, p-path 310 can include additional inverters that are connected in series. For example, p-path 310 can include inverter IV1, which is formed from transistors M9/M10, that has an input IN1 and an output OT1 that is connected to the gate node NG1. In addition, path 310 can include an inverter IV2, which is formed from transistors M11/M12, that has an input IN2 and an output OT2 that is connected to input IN1.

N-path inverter 316 includes a PMOS transistor M18 and an NMOS transistor M15 that have gates connected to a gate node NG2 and drains that are connected to the gate of transistor M5. Further, as shown in FIG. 3, n-path 314 can include additional inverters that are connected in series.

For example, n-path 314 can include inverter IV3, which is formed from transistors M14/M17, that has an input IN3 and an output OT3 that is connected to the gate node GN2. In addition, path 314 can include an inverter IV4, which is formed from transistors M13/M16, that has an input IN4 and an output OT4 that is connected to input IN3.

The transistors in the p-channel and n-channel delay paths 310 and 314 are sized to provide the required edge timing shown in FIG. 2. For example, in the FIG. 3 embodiment, p-channel transistor M8 is 3× larger than p-channel transistor M18. As a result, transistor M8 sources 3× more current than transistor M18 which, in turn, allows transistor M8 to raise the voltage on the gate of transistor M0 faster than transistor M18 can raise the voltage on the gate of transistor M5.

Returning again to FIG. 1, driver stage 100 additionally includes a first switch SW1 that is connected to the control signal CS, and the well of transistor M0 via node N2; and a second switch SW2 that is connected to ground VSS and the control signal CS. In addition, driver stage 100 includes a resistor R46 that is connected to the well of transistor M0 via node N2 and to switch SW2.

As shown in FIG. 4B, switch SW2 can be implemented as an n-channel MOS transistor M27 that has an n+ source connected to ground VSS and an n+ drain connected to resistor R. In addition, transistor M27 has a gate connected to the control signal CS, and a substrate connected to a p bulk voltage PBULK.

As shown in FIG. 4B, switch SW2 can be implemented as a n-channel MOS transistor M27 that has an n+ source connected to ground VSS and an n+ drain connected to resistor R. In addition, transistor M27 has a gate connected to the control signal CS, and a substrate connected to a p bulk voltage PBULK.

In operation, driver stage 100 sinks current from node N1 when transistor M0 is turned off and transistor M5 is turned on. Transistor M5 turns on when the voltage of gate signal G2 rises such that the gate-to-source voltage is greater than the threshold voltage of transistor M5.

The voltage of gate signal G1 also rises to turn off transistor M0. At the same time, the control signal CS, which is the inverse of the gate signal G1, falls. The falling control signal CS, in turn, closes switch SW1 and opens switch SW2. When switch SW1 closes, the voltage on the well of transistor M0 is pulled up to approximately the supply voltage VDD.

In addition, driver stage 100 sources current into node N1 when transistor M0 is turned on and transistor M5 is turned off. Transistor M0 turns on when the voltage on gate signal G1 falls such that the gate-to-source voltage is less than the threshold voltage of transistor M0.

At the same time, the control signal CS, which is the inverse of the gate signal G1, rises. The rising control signal CS opens switch SW1 and closes switch SW2. When switch SW2 closes, the voltage on the well of transistor M0 is pulled down towards ground via a trickle of current that flows through resistor R46.

With respect to the examples shown in FIGS. 3, 4A, and 4B, the control signal CS goes low when the gate signal G1 goes high to turn off transistor M0, thereby turning off transistor M27 and turning on transistor M31. When transistor M31 turns on, the voltage on the well of transistor M0 is pulled up to approximately the supply voltage VDD.

On the other hand, the control signal CS goes high when the gate signal G1 goes low to turn on transistor M0, thereby turning off transistor M31 and turning on transistor M27. When transistor M27 turns on, the voltage on the well of transistor M0 is pulled down towards ground via a trickle of current that flows through resistor R46.

Thus, the present invention provides a bulk switching that pulls down the voltage on the n bulk of PMOS transistor M0 when transistor M0 is turned on, and pulls up the voltage on the n bulk of transistor M0 when transistor M0 is turned off. By pulling the n bulk down during the on state, the threshold voltage of transistor M0 can be increased by several hundred millivolts.

Since the threshold voltage of transistor M0 can be reduced, driver stage 100 can operate at a lower supply voltage and, therefore, requires less power to operate. In addition, by pulling the n bulk up during the off state, the lower leakage current associated with a high n bulk can be realized.

Further, since PMOS transistor M0 is a driver transistor, transistor M0 is a high-voltage transistor that has a threshold voltage of about −1V. For a low-voltage supply, e.g., 2.6V, a 0.3V or 0.4V improvement in the threshold voltage provides about a 10% total improvement in the drain-to-source turn on resistance of PMOS transistor M0. This, in turn, reduces the silicon area that is required by PMOS transistor M0 by about 10% since the transconductance is a linear function of the gate voltage in the linear and subthreshold region.

FIG. 5 shows a circuit diagram that illustrates a driver stage 500 in accordance with an alternate embodiment of the present invention. Stage 500 is similar to stage 100 and, as a result, utilizes the same reference numerals to designate the structures which are common to both stages.

As shown in FIG. 5, stage 500 differs from stage 100 in that stage 500 includes a third switch SW3 that is connected to and between the well of PMOS transistor M0 and the supply voltage VDD, and controlled by an enable signal EN. Switch SW3 can be implemented with, for example, PMOS transistor M31. In this case, the source and well of transistor M31 are connected to the supply voltage, the drain to node N2, and the gate to the enable signal EN.

As further shown in FIG. 5, stage 500 additionally includes a fourth switch SW4 that is connected to and between resistor R and switch SW2, and controlled by the enable signal EN. Switch SW4 can be implemented with, for example, NMOS transistor M27. In this case, the source is connected to switch SW2, the drain is connected to resistor R46, and the gate is connected to the enable signal EN.

In operation when the enable signal EN is a logic low, switch SW3 is open while switch SW4 is closed. When switch SW4 is closed, the voltage on the well of PMOS transistor M0 is pulled up to about the supply voltage VDD and held there as transistor M0 is turned on and off.

On the other hand, when the enable signal EN is a logic high, switch SW3 is closed, while switch SW4 is open. When switch SW3 is closed and switch SW4 is open, stage 500 operates the same as stage 100. Thus, stage 500 provides an enable capability that allows the voltage on the n-well of PMOS transistor M0 to be held high rather than be switched low when transistor M0 turns on.

The enable signal EN can be used in a number of different ways. For example, the enable signal EN can be used to form a driver with an adjustable PMOS threshold voltage. When the enable signal EN is deasserted and the n bulk is held high, PMOS transistor M0 has a first threshold voltage, e.g., −1V.

On the other hand, when the enable signal EN is asserted and the bulk switching is enabled, PMOS transistor M0 has a second threshold voltage, e.g., −0.8V, that is higher than the first threshold voltage. In addition, the enable signal EN allows the bulk switching to be disabled for use in high voltage applications, and can be used with a clock signal to turn the bulk switching on and off.

In addition, rather than connecting switch SW1 to the supply voltage VDD, switch SW1 can alternately be connected to a voltage source that is higher than the supply voltage VDD. In this embodiment, the threshold voltage of PMOS transistor M0 can be lowered even further when the bulk switching is enabled.

Figure 6A:
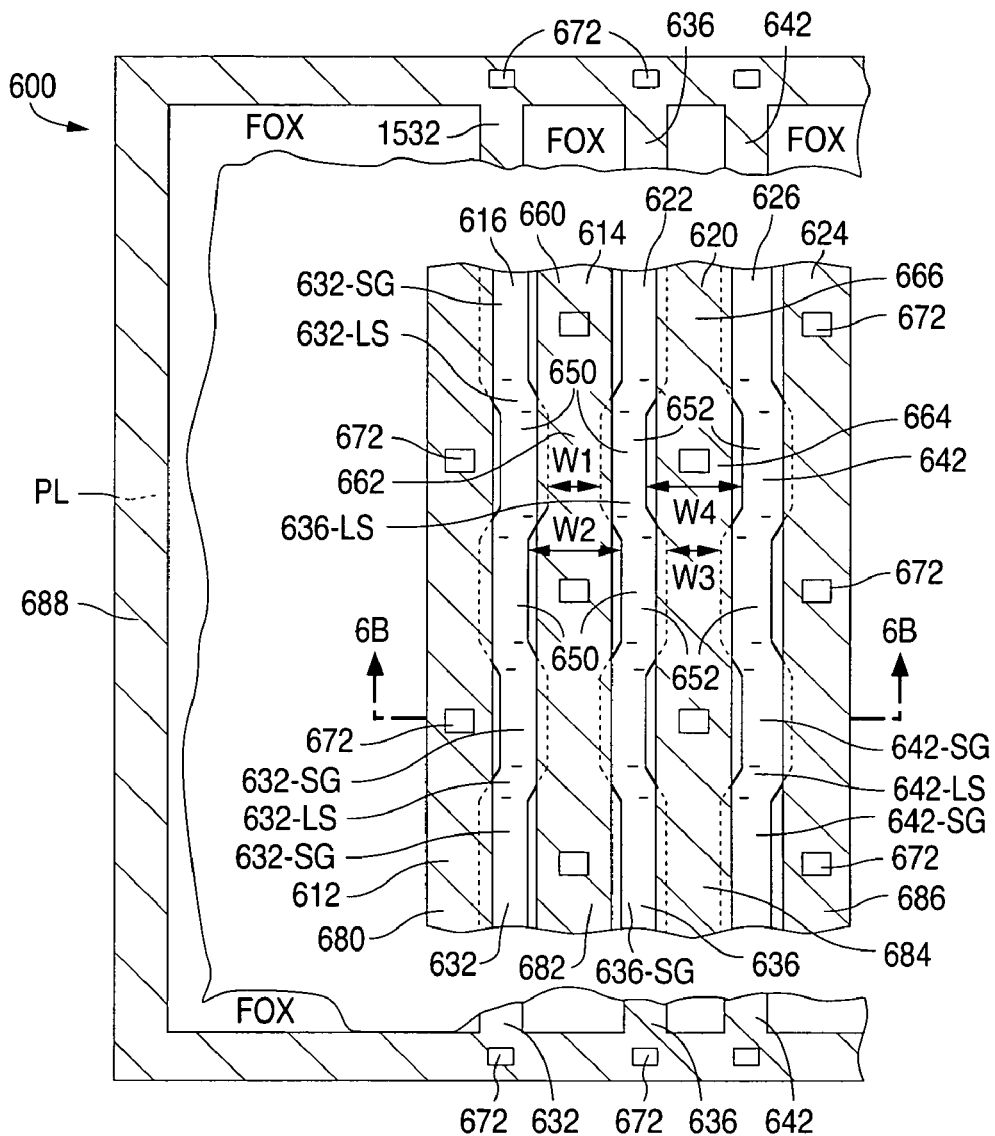
FIGS. 6A–6B are two views illustrating a layout 600 of PMOS transistor M0 after the metal-1 layer has been formed and patterned in accordance with the present invention.
Figure 6B:
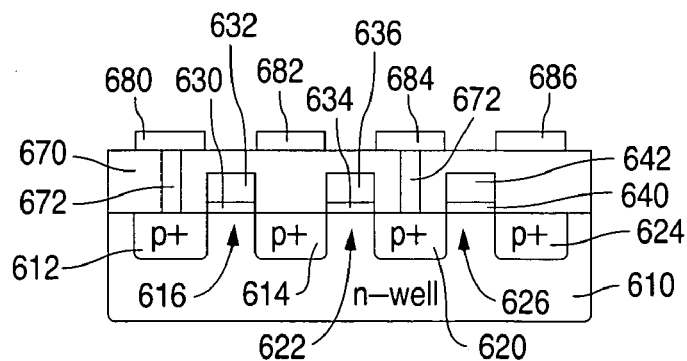

FIGS. 6A–6B show two views that illustrate a layout 600 of PMOS transistor M0 after the metal-1 layer has been formed and patterned in accordance with the present invention. FIG. 6A shows a plan view, while FIG. 6B shows a cross-sectional view taken along lines 6B—6B of FIG. 6A. As shown in FIGS. 6A–6B, layout 600 includes an n-well 610, and a strip of a p+ source region 612 that is formed in an n-well 610.

Layout 600 also includes a strip of a p+ drain region 614 that is formed in an n-well 610 a distance apart from source region 612, and a channel region 616 that is located between source and drain regions 612 and 614. Layout 600 further includes a strip of a p+ source region 620 that is formed in an n-well 610 a distance apart from drain region 614, and a channel region 622 that is located between source and drain regions 620 and 614.

Further, layout 600 includes a strip of a p+ drain region 624 that is formed in an n-well 610 a distance apart from source region 620, and a channel region 626 that is located between source and drain regions 620 and 624. Additional strips of p+ source and drain regions can be used to increase the size of transistor M0.

As shown in FIGS. 6A–6B, layout 600 further includes a layer of gate oxide 630 that is formed over channel region 616, and a polysilicon gate strip 632 that is formed on oxide layer 630 over channel region 616. In addition, both ends of polysilicon gate strip 632 extend out over a field oxide region FOX.

A layer of gate oxide 634 is also formed over channel region 622, and a polysilicon gate strip 636 is formed on oxide layer 634 over channel region 622. Both ends of polysilicon gate strip 636 also extend out over the field oxide region FOX. A layer of gate oxide 640 is further formed over channel region 626, and a polysilicon gate strip 642 is formed on oxide layer 640 over channel region 626. Both ends of polysilicon gate strip 642 extend out over the field oxide region FOX. As further shown in FIG. 6A, polysilicon gate strips 632, 636, and 642 on both ends are connected together via a polysilicon interconnect line PL.

Gate strip 632 has a number of segments 632-SG, and a number of linking sections 632-LS that connect together adjacent segments 632-SG. Similarly, gate strip 636 has a number of segments 636-SG, and a number of linking sections 636-LS that connect together adjacent segments 632-SG. Gate strip 642 also has a number of segments 642-SG, and a number of linking sections 642-LS that connect together adjacent segments 642-SG.

In addition, the segments 632-SG of gate strip 632, the segments 636-SG of gate strip 636, and the segments 642-SG of gate strip 642 are substantially parallel. Each segment 632-SG of gate strip 632 also has a corresponding segment 636-SG of gate strip 636.

Each segment 632-SG and the corresponding segment 636-SG form a segment pair 650 that has a width measured substantially normal to both segments 632-SG and 636-SG. Further, the width of each adjacent segment pair 650 alternates between a first width W1 and a second width W2 that is wider than first width W1.

In addition, each segment 636-SG of gate strip 636 has a corresponding segment 642-SG that lies a distance apart. Each segment 636-SG and the corresponding segment 642-SG form a segment pair 652 that has a width measured substantially normal to both segments 636-SG and 642-SG.

Further, the width of each adjacent segment pair 652 alternates between a third width W3 and a fourth width W4 that is wider than third width W3. In addition, each segment pair 650 has a corresponding and adjoining segment pair 652. When a segment pair 650 has the second width, the corresponding segment pair 652 has the third width. Similarly, when a segment pair 650 has the first width, the corresponding segment pair 652 has the fourth width.

As shown in FIG. 6A, a number of adjacent segment pairs 650 forms an alternating series of wide and narrow regions 660 and 662, respectively, while a number of adjacent segment pairs 652 forms an alternating series of wide and narrow regions 664 and 666, respectively.

In addition to the above, layout 600 also includes a layer of isolation material 670, and a number of contacts 672 that are formed through isolation material 670 to make an electrical connection with source strip 612, drain strip 614, source strip 620, drain strip 624, and interconnect line PL. The contacts 672, in turn, are formed generally in the middle of each wide region 660 and 664, and periodically on interconnect line PL.

Further, layout 600 includes a plurality of strips of metal-1 that include a source strip 680, a drain strip 682, a source strip 684, a drain strip 686, and an interconnect strip 688. Source strip 680 is formed on isolation material 670 to make electrical contact with the contacts 672 that make an electrical connection with p+ source strip 612.

Drain strip 682 is formed on isolation material 670 to make electrical contact with the contacts 672 that make an electrical connection with p+ drain strip 614. Source strip 684 is formed on isolation material 670 to make electrical contact with the contacts 672 that make an electrical connection with p+ source strip 620.

Drain strip 686 is formed on isolation material 670 to make electrical contact with the contacts 672 that make an electrical connection with p+ drain strip 624. Interconnect strip 688 is formed on isolation material 670 to make electrical contact with the contacts 672 that make an electrical connection with polysilicon interconnect line PL which, in turn, is connected to gate strips 632, 636, and 642.

Thus, in accordance with the present invention, a layout has been described that utilizes a plurality of serrated gate structures that allow the source and drain regions to contacted frequently. The result is a 25% savings in space over conventional layouts.

In addition, picking up the gate strips on both ends with a layer of interconnect polysilicon and a metal-1 strip reduces the distributed RC delay associated with the gate strips (the resistance of the polysilicon strips and the capacitance under the gate strips) by a factor of two to three times.

Figure 7A:
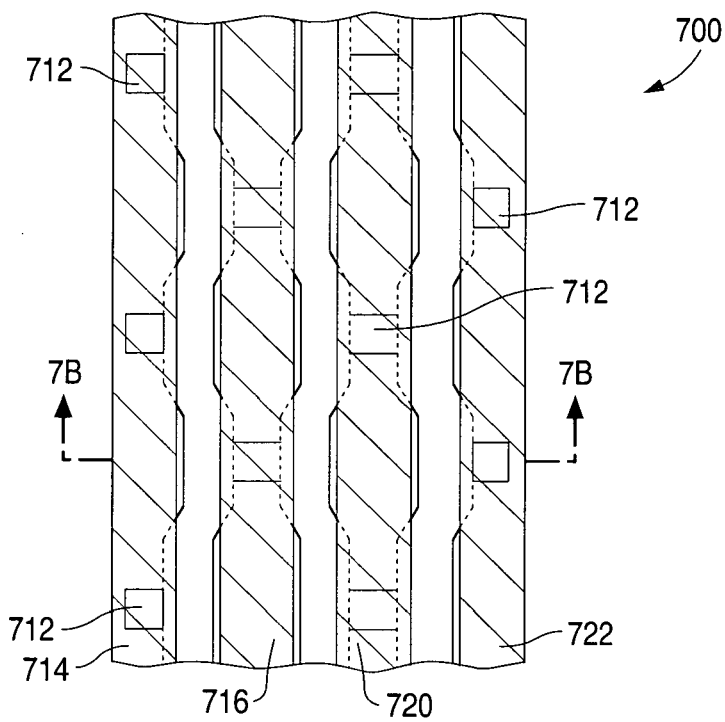
FIGS. 7A–7B are two views illustrating a layout 700 of PMOS transistor M0 after the metal-2 layer has been formed and patterned in accordance with the present invention.
Figure 7B:
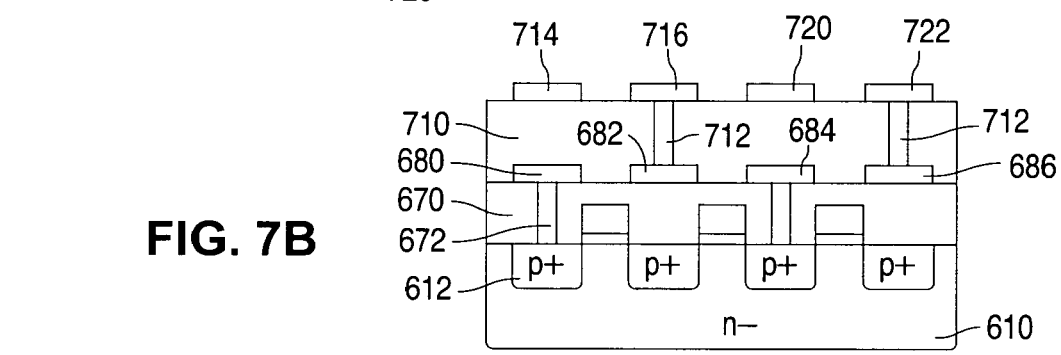

FIGS. 7A–7B show two views that illustrate a layout 700 of PMOS transistor M0 after the metal-2 layer has been formed and patterned in accordance with the present invention. FIG. 7A shows a plan view, while FIG. 7B shows a cross-sectional view taken along lines 7B—7B of FIG. 7A. As shown in FIGS. 7A–7B, layout 700 is the same as layout 600 except that layout 700 shows the additional formation of a layer of isolation material 710, vias 712 that are formed through isolation layer 710, and a plurality of strips of metal-2.

The metal-2 strips include a source strip 714, a drain strip 716, a source strip 720, and a drain strip 722. Source strip 714 is formed on isolation material 710 to make electrical contact with the vias 712 that make an electrical connection with source strip 780.

Drain strip 716 is formed on isolation material 710 to make electrical contact with the contacts 712 that make an electrical connection with drain strip 682. Source strip 720 is formed on isolation material 710 to make electrical contact with the contacts 712 that make an electrical connection with p+ source strip 684.

Drain strip 722 is formed on isolation material 712 to make electrical contact with the contacts 712 that make an electrical connection with drain strip 686. (Although not shown, a metal-2 interconnect strip is formed over the metal-1 interconnect strip 688 and electrically connected by vias.)

Figure 8A:
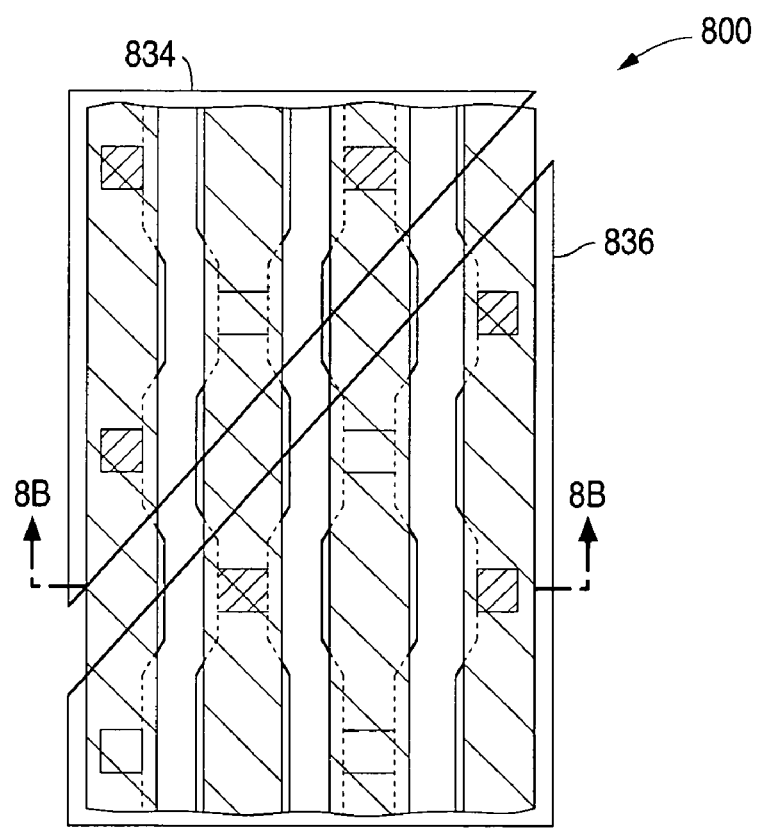
FIGS. 8A–8B are two views illustrating a layout 800 of PMOS transistor M0 after the metal-4 layer has been formed and patterned in accordance with the present invention.
Figure 8B:
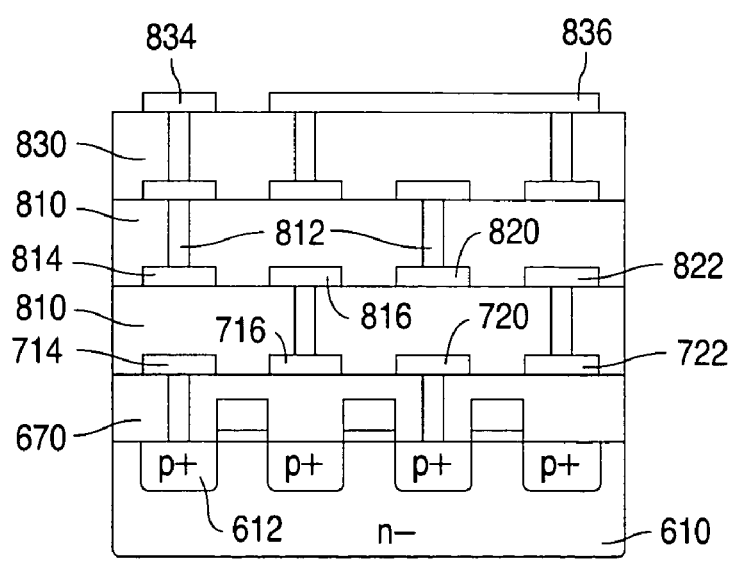

FIGS. 8A–8B show two views that illustrate a layout 800 of PMOS transistor M0 after the metal-4 layer has been formed and patterned in accordance with the present invention. FIG. 8A shows a plan view, while FIG. 8B shows a cross-sectional view taken along lines 8B—8B of FIG. 8A. As shown in FIGS. 8A–8B, layout 800 is the same as layout 700 except that layout 800 shows the additional formation of a layer of isolation material 810, vias 812 that are formed through isolation layer 810, and a plurality of strips of metal-3.

The metal-3 strips include a source strip 814, a drain strip 816, a source strip 820, and a drain strip 822. Source strip 814 is formed on isolation material 810 to make electrical contact with the vias 812 that make an electrical connection with source strip 714. Drain strip 816 is formed on isolation material 810 to make electrical contact with the vias 812 that make an electrical connection with drain strip 716.

Source strip 820 is formed on isolation material 810 to make electrical contact with the contacts 812 that make an electrical connection with p+ source strip 720. Drain strip 822 is formed on isolation material 810 to make electrical contact with the vias 812 that make an electrical connection with drain strip 722. (Although not shown, a metal-3 interconnect strip is formed over the metal-2 interconnect strip and electrically connected by vias.)

Layout 800 shows the additional formation of a layer of isolation material 830, vias 832 that are formed through isolation layer 830, and two triangles of metal-4. The metal-4 triangles include a source triangle 834 and a drain triangle 836. Source triangle 834 is formed on isolation material 830 to make electrical contact with all of the vias 812 that make an electrical connection with metal-3 source strips, including source strips 814 and 820. Drain triangle 836 is formed on isolation material 830 to make electrical contact with all of the vias 832 that make an electrical connection with metal-3 drain strips, including drain strips 816 and 822.

Figure 9:
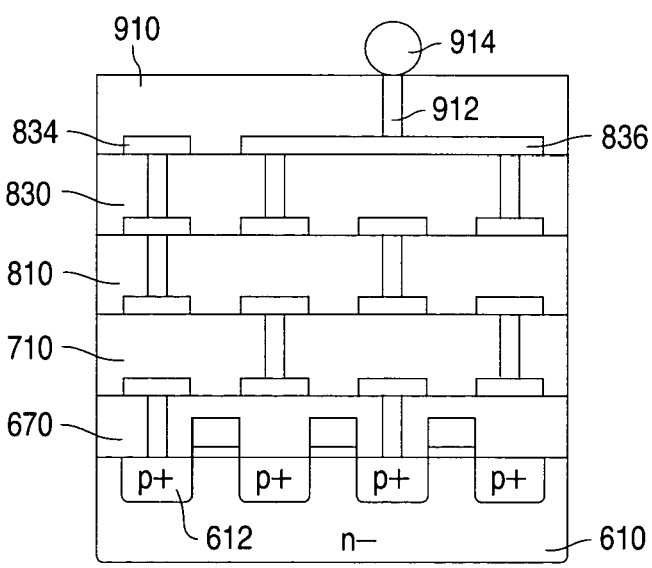
FIG. 9 is a cross-sectional view taken along lines 8B—8B of FIG. 8A illustrating a layout 900 after the formation of solder balls in accordance with the present invention.

FIG. 9 shows a cross-sectional view taken along lines 8B—8B of FIG. 8A that illustrates a layout 900 after the formation of solder balls in accordance with the present invention. As shown in FIG. 9, layout 900 is the same as layout 800 except that layout 900 shows the additional formation of a layer of isolation material 910, vias 912 that are formed through isolation layer 910, and a plurality of solder balls 914. Solder balls 914 are formed as big balls to minimize parasitic contributions to the source-to-drain turn on resistance of PMOS transistor M0.

Other than differing conductivity types (e.g., n+ source and drain regions in lieu of p+ source and drain regions), the layout of transistor M5 of FIG. 1 is the same as the layout of transistor M0 of FIG. 1. In accordance with an alternate embodiment of the present invention, the contacts and vias used in PMOS transistor M0 are larger (wider) than the contacts and vias used in NMOS transistor M5.

As a result, the larger contacts used on PMOS transistor M0 reduce the resistance associated with the contacts. (Larger contacts are not used on the NMOS transistor M5 because the p+ source, n-channel region, and p+ drain form a parasitic bipolar transistor which, in response to transients, can exhibit snapback characteristics if the transients exceed the rail or falls below ground.)

In accordance with a further embodiment of the present invention, the source regions (which correspond with the emitter of the parasitic bipolar transistor) of NMOS transistor M5 are wider than the drain regions of NMOS transistor M5 (while the source and drain regions both have the same length and depth). In this embodiment, the contacts and vias of PMOS transistor M0 are the same size as the contacts and vias of NMOS transistor M5, however, NMOS transistor has more gate strips than PMOS transistor M0.

Increasing the width of the source regions effectively increases the resistance. Since the source regions function as the emitter regions of the parasitic bipolar transistor, increasing the widths of the source regions is equivalent to adding resistance to the emitter of a bipolar transistor.

By ballasting, adding resistance to the emitter, a large number of bipolar transistors can be placed in parallel without one transistor, usually the center one, heating up and hogging the current. Thus, the wider source regions more evenly distribute the current and reduce the likelihood that the parasitic bipolar transistors in NMOS transistor M5 will enter snapback and fail.

Thus, an output driver stage, including the layout of the PMOS driver transistor of the output stage, has been described. The present invention utilizes both circuit techniques (pulling down the well) and layout techniques, (serrated gate structures) to obtain approximately a 25%–35% improvement in the source-to-drain turn on resistance of PMOS transistor M0.

It should be understood that the above descriptions are examples of the present invention, and various alternatives to the embodiment of the invention described herein may be employed in practicing the invention. Thus, it is intended that the following claims define the scope of the invention and that methods and structures within the scope of these claims and their equivalents be covered thereby.

What is claimed is:

1. A MOS transistor formed in a semiconductor material of a first conductivity type, the MOS transistor comprising:

a plurality of source strips of a second conductivity type formed in the semiconductor material, each source strip having a depth, a length, and a width;

a plurality of drain strips of the second conductivity type formed in the semiconductor material such that a drain strip lies between each adjacent pair of source strips, each drain strip having the depth, the length, and a width;

a plurality of channel strips located between the source and drain strips such that a channel strip is located between each adjacent source and drain strip;

a plurality of gate strips formed over the channel strips between source strips and drain strips, the plurality of gate strips being isolated from the plurality of channel strips; and a single source metal region formed over the plurality of source and drain strips to make electrical connections with the plurality of source strips, the single source metal region covering more than 25% and less than 50% of the plurality of source and drain strips.

2. The MOS transistor of claim 1 and further comprising a single drain metal region formed over the plurality of source and drain strips to make electrical connections with the plurality of drain strips, the single drain metal region covering more than 25% and less than 50% of the plurality of source and drain strips.

3. The MOS transistor of claim 1 wherein the width of a source strip is wider than the width of a drain strip.

4. The MOS transistor of claim 1 wherein a gate strip has a serpentine shape.

5. The MOS transistor of claim 1 wherein each gate strip is electrically connected together.

6. The MOS transistor of claim 1 and further comprising:
a MOS device having a source connected to a ground node, a gate, and a drain electrically connected to the plurality of drain strips; and
a gate signal generator that outputs a first gate signal to the plurality of gate strips, a second gate signal to the gate of the MOS device, and a control signal, the first and second gate signals being non-overlapping;
a first switch connected to the control signal, and the semiconductor material of the first conductivity type;
a second switch connected to the ground node and the control signal; and
a resistor that is connected to the semiconductor material of the first conductivity type, a current flowing through the resistor to the ground node when the second switch is closed, and not flowing when the second switch is open.

7. The MOS transistor of claim 6 wherein the control signal has a logic state opposite to the logic state of the first gate signal.

8. The driver of claim 6 and further comprising:
a third switch connected to the second switch and the resistor that is controlled by an enable signal; and
a fourth switch connected to a voltage source and the resistor that is controlled by the enable signal.

9. A MOS transistor formed in a semiconductor material of a first conductivity type, the MOS transistor comprising:

a plurality of source strips of a second conductivity type formed in the semiconductor material, each source strip having a depth, a length, and a width;

a plurality of drain strips of the second conductivity type formed in the semiconductor material such that a drain strip lies between each adjacent pair of source strips, each drain strip having the depth, the length, and a width, the width of a source strip being greater than a width of a drain strip;

a plurality of channel strips located between the source and drain strips such that a channel strip is located between each adjacent source and drain strip; and a plurality of gate strips formed over the channel strips between source strips and drain strips, the plurality of gate strips being isolated from the plurality of channel strips.

10. The MOS transistor of claim 9 and further comprising a single source metal region formed over the plurality of source and drain strips to make electrical connections with the plurality of source strips, the single source metal region covering more than 25% and less than 50% of the plurality of source and drain strips.

11. The MOS transistor of claim 10 and further comprising a single drain metal region formed over the plurality of source and drain strips to make electrical connections with the plurality of drain strips, the single drain metal region covering more than 25% and less than 50% of the plurality of source and drain strips.

12. The MOS transistor of claim 9 wherein a gate strip has a serpentine shape.

13. The MOS transistor of claim 9 wherein each gate strip is electrically connected together.

14. The MOS transistor of claim 9 and further comprising:
a MOS device having a source connected to a ground node, a gate, and a drain electrically connected to the plurality of drain strips; and
a gate signal generator that outputs a first gate signal to the plurality of gate strips, a second gate signal to the gate of the MOS device, and a control signal, the first and second gate signals being non-overlapping;
a first switch connected to the control signal, and the semiconductor material of the first conductivity type;
a second switch connected to the ground node and the control signal; and
a resistor that is connected to the semiconductor material of the first conductivity type, a current flowing through the resistor to the ground node when the second switch is closed, and not flowing when the second switch is open.

15. The MOS transistor of claim 14 wherein the control signal has a logic state opposite to the logic state of the first gate signal.

16. The driver of claim 14 and further comprising:
a third switch connected to the second switch and the resistor that is controlled by an enable signal; and
a fourth switch connected to a voltage source and the resistor that is controlled by the enable signal.

\* \* \* \* \*